US009484235B2

(12) United States Patent
Itou et al.

(10) Patent No.: US 9,484,235 B2
(45) Date of Patent: Nov. 1, 2016

(54) SUBSTRATE PROCESSING APPARATUS, SUBSTRATE TRANSFER METHOD AND STORAGE MEDIUM

(71) Applicant: Tokyo Electron Limited, Tokyo (JP)

(72) Inventors: Kouichi Itou, Koshi (JP); Masahiro Nasu, Koshi (JP); Daisuke Honma, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 519 days.

(21) Appl. No.: 14/021,029

(22) Filed: Sep. 9, 2013

(65) Prior Publication Data

US 2014/0093984 A1    Apr. 3, 2014

(30) Foreign Application Priority Data

Sep. 28, 2012   (JP) ................. 2012-217082

(51) Int. Cl.
| H01L 21/677 | (2006.01) |
| B05C 13/00 | (2006.01) |
| H01L 21/02 | (2006.01) |
| H01L 21/67 | (2006.01) |
| G05B 19/418 | (2006.01) |

(52) U.S. Cl.
CPC ......... *H01L 21/67745* (2013.01); *B05C 13/00* (2013.01); *G05B 19/41865* (2013.01); *H01L 21/02043* (2013.01); *H01L 21/67155* (2013.01); *G05B 2219/32258* (2013.01); *G05B 2219/32272* (2013.01); *Y02P 90/20* (2015.11)

(58) Field of Classification Search
CPC ................... G03F 7/70533; G05B 19/41865; G05B 2219/32096; G05B 2219/32097; G05B 2219/45232; H01L 21/206; H01L 21/2041; H01L 21/2043; H01L 21/2054; H01L 21/2057; H01L 21/67155; H01L 21/67184
See application file for complete search history.

(56) References Cited

U.S. PATENT DOCUMENTS

| 6,945,258 B2 * | 9/2005 | Itou | ................. H01L 21/67178 118/668 |
| 7,618,203 B2 * | 11/2009 | Fujimaru | .......... H01L 21/67276 118/663 |
| 8,145,334 B2 * | 3/2012 | Do | ........................ G06Q 10/06 700/103 |

(Continued)

FOREIGN PATENT DOCUMENTS

| JP | 11-016983 A | 1/1999 |
| JP | 2011176122 A * | 9/2011 |
| JP | 2012-080077 A | 4/2012 |

*Primary Examiner* — Ben Rifkin
*Assistant Examiner* — Michael J Huntley
(74) *Attorney, Agent, or Firm* — Pearne & Gordon LLP

(57) ABSTRACT

In a substrate processing apparatus 1 which performs a process on a substrate W, each of multiple processing modules 2 includes at least a first processing member 21 and a second processing member 22, and substrate transfer devices 15 and 17 transfer substrates W into the multiple processing modules 2. Further, a controller 3 configured to control the substrate processing apparatus 1 stores member operating possibility information on whether it is possible to use the first processing member 21 and the second processing member 22 provided in each of the multiple processing modules 2, and the controller 3 creates, based on the member operating possibility information and process recipe information on processes to be performed on the substrates W, a transfer schedule in which the substrate transfer devices 15 and 17 transfer the substrates W into the multiple processing modules 2 in parallel.

4 Claims, 15 Drawing Sheets

(56) References Cited

U.S. PATENT DOCUMENTS

| | | | |
|---|---|---|---|
| 8,359,110 B2* | 1/2013 | Kuhn | G05B 23/0262 700/21 |
| 8,630,733 B2* | 1/2014 | Itou | H01L 21/67184 414/225.01 |
| 8,904,397 B2* | 12/2014 | Chen | G06F 11/0709 718/102 |
| 2005/0278050 A1* | 12/2005 | Ruml | G05B 19/41865 700/100 |
| 2006/0259174 A1* | 11/2006 | Daferner | G05B 19/41865 700/100 |
| 2008/0148257 A1* | 6/2008 | Ruml | G05B 19/4184 718/100 |
| 2009/0016860 A1* | 1/2009 | Kaneko | H01L 21/67745 414/222.11 |
| 2010/0082132 A1* | 4/2010 | Marruchella | G05B 19/41835 700/86 |
| 2011/0118868 A1* | 5/2011 | Herrmann | G05B 19/41865 700/214 |
| 2011/0206486 A1* | 8/2011 | Matsuyama | H01L 21/67225 414/222.02 |
| 2012/0058253 A1* | 3/2012 | Miyata | H01L 21/67126 427/58 |

* cited by examiner

FIG. 9

|   | M1 | M2 | M3 | M4 | M5 | M6 | M7 | M8 |
|---|----|----|----|----|----|----|----|----|
| A | ○ | ○ | ○ | ○ | × | ○ | ○ | ○ |
| B | ○ | ○ | ○ | ○ | ○ | ○ | ○ | ○ |
| 1 | W1 | | | | | | | |
| 2 | | W2 | | | | | | |
| 3 | | | W3 | | | | | |
| 4 | | | | W4 | | | | |
| 5 | A | | | | | W5 | | |
| 6 | | A | | | W6 | | | |
| 7 | | | A | | | | W7 | |
| 8 | ↓ | | | A | | A | | W8 |
| 9 | W9 | ↓ | | | B | | | |
| 10 | | W10 | | | | | B | |
| 11 | | | W11 | ↓ | | | | B |
| 12 | B | | | W12 | | ↓ | | |
| 13 | | B | | | | W13 | | |
| 14 | | | A | | | | W14 | |
| 15 | | | | A | | | | |
| 16 | ↓ | | | | | A | | W15 |
| 17 | | ↓ | | | | | | |
| 18 | | | ↓ | | | | A | |
| 19 | | | | ↓ | | | | A |
| 20 | | | | | | ↓ | | |
| 21 | | | B | | | | | |
| 22 | | | | B | | | | |
| 23 | | | | | | B | | ↓ |
| 24 | | | | | | | | |
| 25 | | | ↓ | | | | B | |
| 26 | | | | ↓ | | | | B |
| 27 | | | | | | ↓ | | |
| 28 | | | | | | | | |
| 29 | | | | | | | ↓ | |
| 30 | | | | | | | | ↓ |

*FIG. 10*

SUBSTRATE PROCESSING APPARATUS, SUBSTRATE TRANSFER METHOD AND STORAGE MEDIUM

CROSS-REFERENCE TO RELATED APPLICATION

This application claims the benefit of Japanese Patent Application No. 2012-217082 filed on Sep. 28, 2012, the entire disclosures of which are incorporated herein by reference.

FIELD OF THE INVENTION

The present disclosure relates to a technique of processing a substrate by using a processing module capable of performing multiple processes.

BACKGROUND OF THE INVENTION

As a semiconductor processing apparatus, there is known a single-substrate type processing apparatus in which a FOUP (Front-Opening Unified Pod) is mounted on a mounting unit and a multiple number of processing modules perform parallel processes on substrates taken out of the FOUP. As an example of such substrate processing apparatus, a substrate cleaning apparatus configured to clean a substrate includes a mounting unit configured to mount thereon a multiple number of FOUPs; a multiple number of cleaning modules configured to perform a two-fluid cleaning process by supplying a mixture fluid of a gas and a cleaning liquid onto a target surface of a substrate or to perform a scrub cleaning process by bringing a scrubber such as a brush into contact with the target surface of the substrate that is rotating; and a transfer system configured to transfer substrates between the processing modules and the FOUPs.

A cleaning module configured to perform multiple kinds of processes is capable of performing the multiple kinds of the processes in combinations or capable of performing only a part of the multiple kinds of the processes depending on, e.g., a kind of a substrate or a required cleanness degree. Meanwhile, there may occur a trouble that it is difficult to perform only a part of the multiple kinds of the processes.

In Patent Document 1, there is described a technique for dealing with a trouble when one of a multiple number of processing units is out of order in a substrate processing apparatus in which the processing units perform a same process in parallel. In this technique, when one of the multiple number of the processing units is broken, a substrate supposed to be transferred into the broken processing unit is transferred into another processing unit instead and a required process is performed therein. Patent Document 1, however, does not describe a technique for dealing with a problem that a part of multiple kinds of processes malfunctions in a processing module configured to perform the multiple kinds of processes.

Patent Document 1: Japanese Patent Laid-open Publication No. H11-016983 (Claim 1, paragraphs [0027] and [0028], and FIG. 4)

BRIEF SUMMARY OF THE INVENTION

In view of the foregoing problems, present illustrative embodiments provide a substrate processing apparatus including a processing module capable of performing multiple kinds of processes. In the substrate processing apparatus, even if at least one of the multiple kinds of the processes in the processing module cannot be performed, it is still possible to perform the rest process in the processing module. Further, the present illustrative embodiments also provide a substrate transfer method and a storage medium storing thereon the substrate transfer method.

In accordance with one aspect of an illustrative embodiment, there is provided a substrate processing apparatus of performing a process on a substrate. The substrate processing apparatus includes a multiple number of processing modules each of which includes at least a first processing member and a second processing member; a substrate transfer device configured to transfer substrates into the multiple number of processing modules; and a controller configured to control the substrate processing apparatus. Further, the controller is configured to store member operating possibility information on whether it is possible to use the first processing member and the second processing member provided in each of the multiple number of processing modules. Moreover, the controller is configured to create, based on the member operating possibility information and process recipe information on processes to be performed on the substrates, a transfer schedule in which the substrate transfer device transfers the substrates into the multiple number of processing modules in parallel.

The substrate processing apparatus may have the following characteristics. The substrate processing apparatus may further include a recipe storage unit configured to store thereon process recipes to be performed on the substrates. Further, the member operating possibility information may be made by relating a trouble module serving as a processing module in which at least one of the first processing member and the second processing member is found to be unusable to information on whether it is possible to use each of the first processing member and the second processing member. Furthermore, the controller may be configured to compare kinds of processes included in the process recipes with the member operating possibility information, and if a process that cannot be performed in the trouble module is included in the kinds of the processes, the controller may be configured to set the trouble module as a transfer exception module and exclude the trouble module from the transfer schedule. Moreover, the controller may be configured to designate the trouble module as a transfer exception module based on the member operating possibility information, and if a process that cannot be performed in the trouble module is not included in kinds of processes of the process recipes, the controller may be configured to cancel the trouble module from the transfer exception module. Moreover, the first processing member and the second processing member may be configured to perform, on the substrates, processes selected from a process group consisting of a two-fluid cleaning process, a scrub cleaning process, a substrate rear surface cleaning process, a chemical liquid cleaning process, a coating and developing process and a plating process.

In accordance with the illustrative embodiments, in the processing module capable of performing the multiple kinds of the processes, even if at least one of the multiple kinds of processes cannot be performed, the rest process can be performed in the processing module. Accordingly, it is possible to efficiently perform substrate processes.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 9 is an explanatory diagram illustrating an example transfer schedule created in the cleaning apparatus;

FIG. 10 is an explanatory diagram illustrating an example transfer schedule when the illustrative embodiment is not applied;

DETAILED DESCRIPTION OF THE INVENTION

Figure 1:
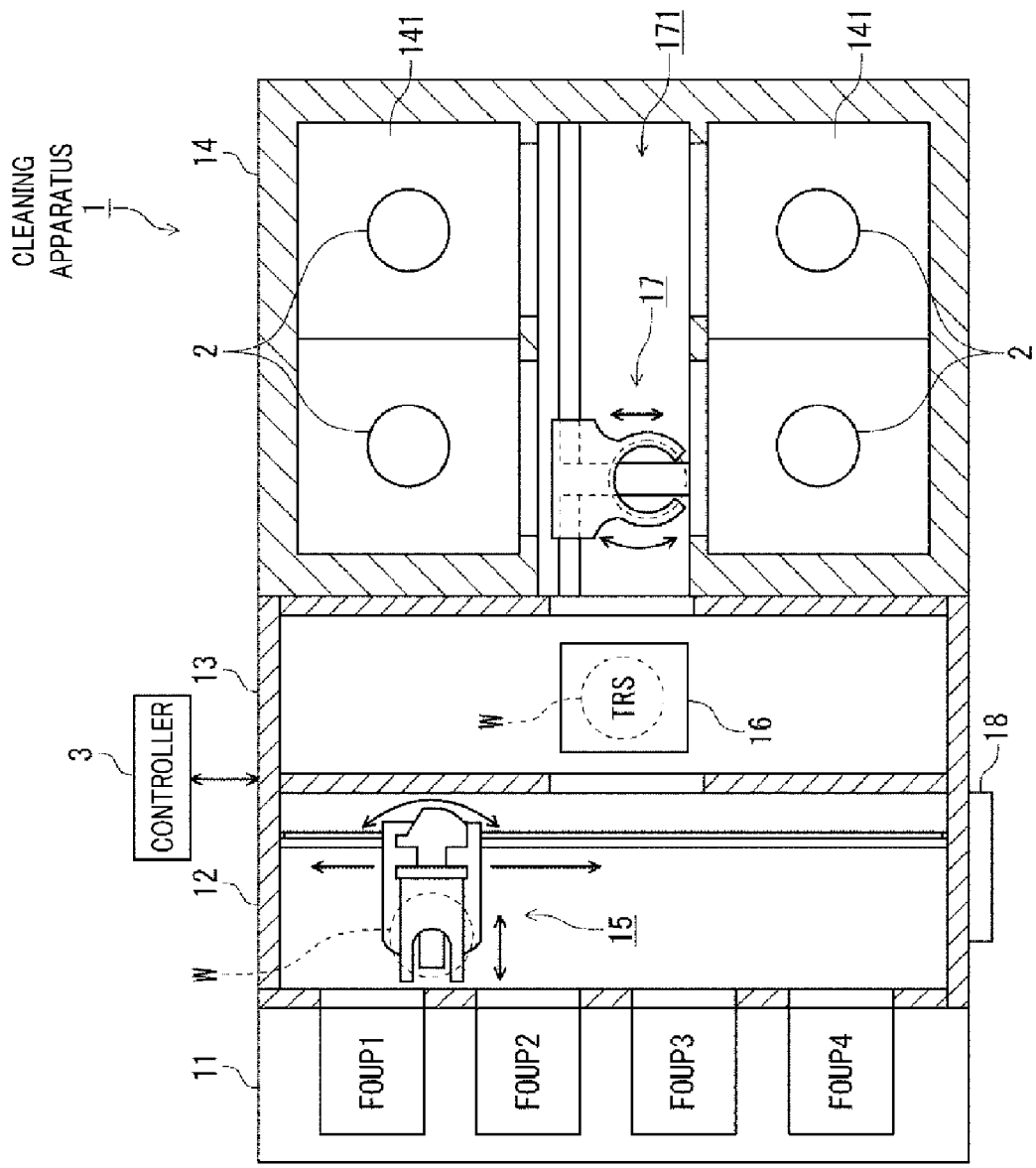
FIG. 1 is a plane view illustrating a schematic configuration of a cleaning apparatus in accordance with a first illustrative embodiment.

Hereinafter, a cleaning apparatus 1 (substrate processing apparatus) having a multiple number of cleaning modules 2 (corresponding to processing modules) in accordance with an illustrative embodiment will be described. Each cleaning module 2 is configured to be capable of performing two types of processes: a two-fluid cleaning process (first process) of supplying a mixture fluid of a gas and a cleaning liquid onto a wafer W; and a scrub cleaning process (second process) of cleaning a target surface of the wafer W by bringing a scrubber into contact with the wafer W while supplying a cleaning liquid. As depicted in a plane view of FIG. 1, the cleaning apparatus 1 includes a mounting block 11, a loading/unloading block 12, a transit block 13 and a cleaning block 14. The mounting block 11 is configured to mount thereon FOUP1 to FOUP4 each of which serves as a transfer vessel accommodating therein a multiple number of wafers W. The loading/unloading block 12 is configured to load and unload the wafer W into and from the FOUP1 to the FOUP4 mounted on the mounting block 11. The transit block 13 is configured to deliver the wafer W between the loading/unloading block 12 and the cleaning block 14 located at a rear end of the transit block 13. The cleaning block 14 is configured to perform a cleaning process on the wafer W. The mounting block 11, the loading/unloading block 12, the transit block 13 and the cleaning block 14 are disposed adjacent to each other in this sequence with the mounting block 11 positioned at a front end. Further, a manipulation unit 18 implemented by, but not limited to, a touch panel type liquid crystal display is provided on an outer wall of the loading/unloading block 12.

The mounting block 11 mounts thereon, e.g., four FOUPs (FOUP1 to FOUP4), each of which accommodates therein a multiple number of wafers W horizontally. The loading/unloading block 12 transfers the wafers W. The transit block 13 delivers the wafer W. The loading/unloading block 12 and the transit block 13 are accommodated in a housing.

The loading/unloading block 12 includes a first wafer transfer device 15. The first wafer transfer device 15 is configured to be movable in an arrangement direction of the FOUP1 to the FOUP4, and has a transfer arm configured to hold thereon a wafer W. The transfer arm is configured to be movable back and forth and rotatable in a horizontal direction and, also, to be movable up and down in a vertical direction. The loading/unloading block 12 transfers the wafer W between the FOUP1 to the FOUP4 and the transit block 13.

The transit block 13 includes a transit shelf 16 capable of mounting thereon, e.g., eight sheets of wafers W. In the transit block 13, the wafer W is delivered between the loading/unloading block 12 and a transfer device of the cleaning block 14 (between the first wafer transfer device 15 described above and a second wafer transfer device 17 to be described later) via the transit shelf 16. The first wafer transfer device 15 and the second wafer transfer device 17 correspond to substrate transfer devices in accordance with the present illustrative embodiment.

The cleaning block 14 accommodates, in a housing, a cleaning unit 141 having therein a multiple number of the cleaning modules 2; and a transfer unit 171 configured to transfer a wafer W. The transfer unit 171 includes the second wafer transfer device 17 disposed in a space extended in a forward/backward direction with a connection part to the transit block 13 as a base end. The second wafer transfer device 17 is configured to be movable along the direction in which the transfer unit 171 is extended. Further, the second wafer transfer device 17 has a transfer arm configured to hold thereon a wafer W, and the transfer arm is configured to be movable back and forth and rotatable in a horizontal direction, and movable up and down in a vertical direction. The second wafer transfer device 17 having this configuration serves to transfer wafer W between the transit shelf 16 and each of the cleaning modules 2.

Figure 3:
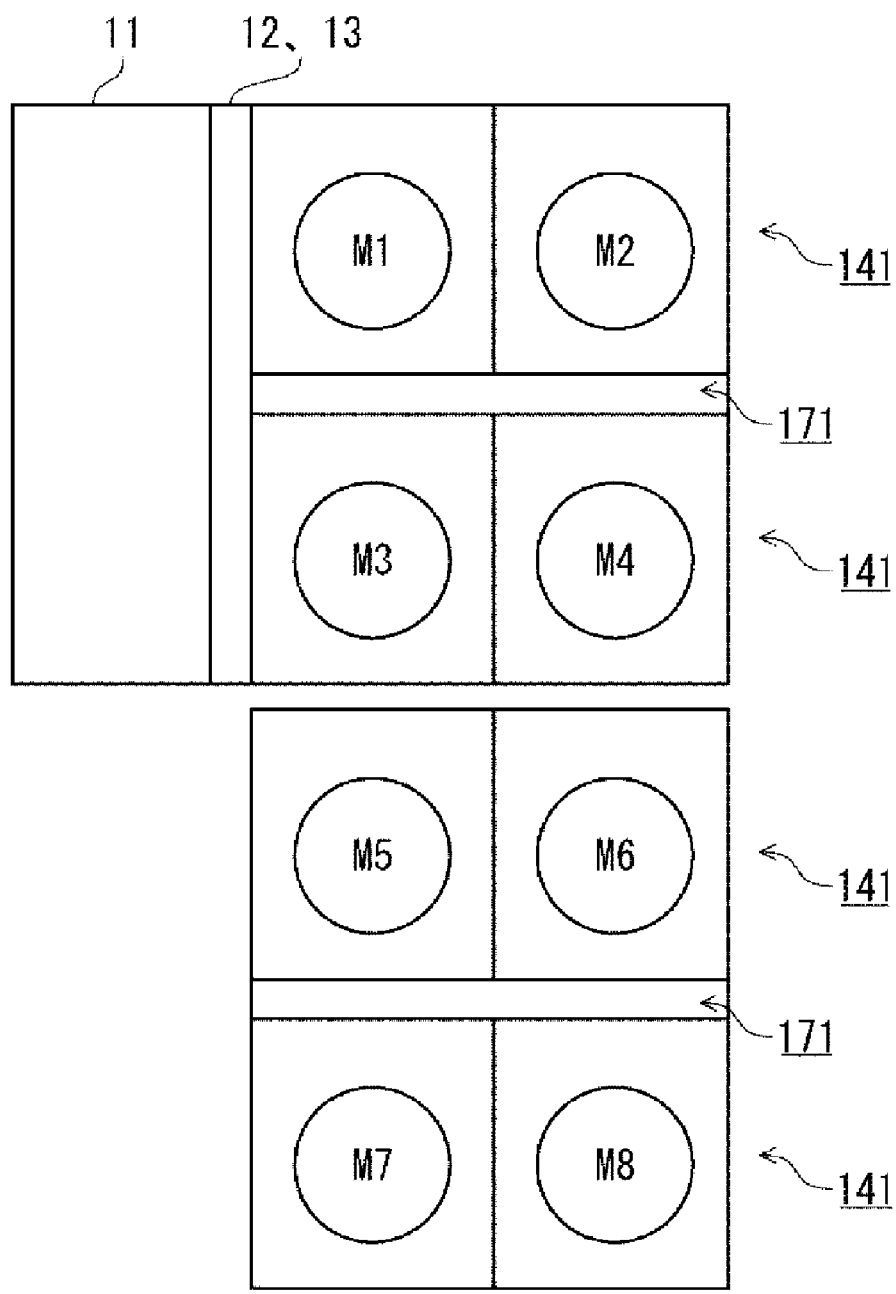
FIG. 3 is a schematic diagram illustrating a layout of cleaning modules provided in the cleaning apparatus.

As shown in FIG. 1, the cleaning unit 141 includes, for example, a total number of eight cleaning modules 2 vertically arranged in two levels. In each level, two cleaning modules 2 are arranged at each of both sides of the transfer unit 171 along the direction in which the transfer unit 171 is extended. Each of the eight cleaning modules 2 is configured to perform the aforementioned two-fluid cleaning process or scrub cleaning process in parallel. Further, as schematically illustrated in FIG. 3, the cleaning modules are assigned reference numerals M1 to M8, respectively.

Figure 2:
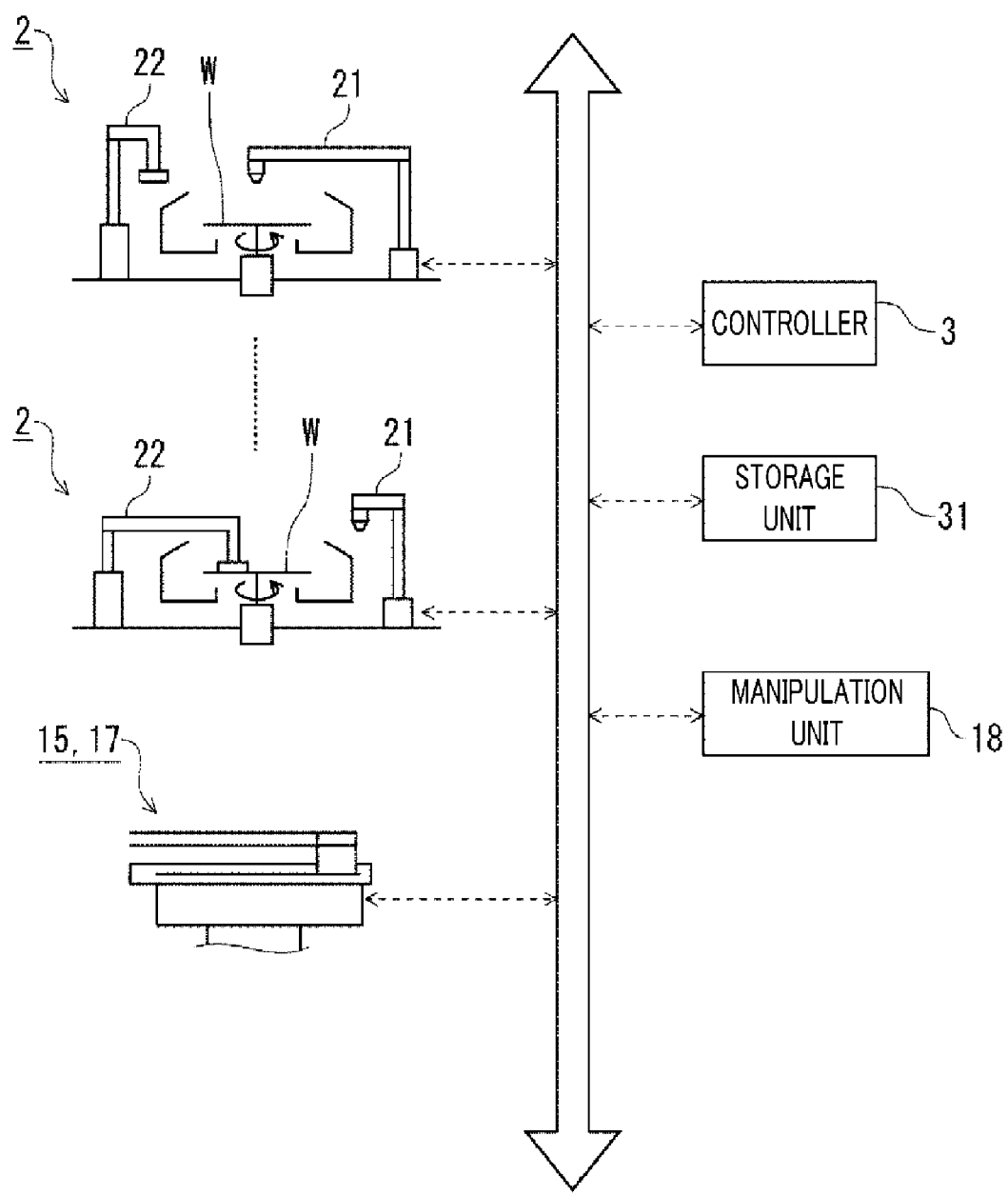
FIG. 2 is a block diagram illustrating an electric configuration of the cleaning apparatus.

As shown in FIG. 2, each cleaning module 2 includes a two-fluid cleaning unit 21 having a two-fluid nozzle; and a scrubbing unit 22 having a scrubber. The two-fluid cleaning unit 21 is configured to perform a two-fluid cleaning process on a wafer W that is rotating on a spin chuck, and the scrubbing unit 22 is configured to perform a scrub cleaning process. The respective cleaning modules 2 may perform the cleaning processes under different processing conditions (e.g., a kind of a cleaning liquid, a cleaning region, and a cleaning time) depending on a material of the wafer W, a process to be performed in another processing apparatus before and after the target cleaning process, or the like. Further, as shown in Table 1 below, a two-fluid cleaning process using the two-fluid cleaning unit 21 is assigned a notation A, and a scrub cleaning process using the scrubbing unit 22 is assigned a notation B. In the present illustrative embodiment, the two-fluid cleaning unit corresponds to a first processing member, and the scrubbing unit 22 corresponds to a second processing member.

TABLE 1

| Content of Process | Notation for Identification |
|---|---|
| Two-fluid Cleaning Process | A |
| Scrub Cleaning Process | B |

As shown in FIG. 2, the cleaning apparatus 1 is connected to a controller 3. The controller 3 may be implemented, but not limited to, a computer having a non-illustrated CPU and operated based on a program read out from a storage unit 31. The storage unit 31 is configured to store thereon programs including control step (command) groups regarding the operations of the cleaning apparatus 1, i.e., operations of taking out the wafer W from the FOUP1 to the FOUP4 mounted on the mounting block 11, loading the wafer W into the respective cleaning modules 2, performing a cleaning process and returning the wafer W back into the FOUP1 to the FOUP4 in which the wafer W is originally accommodated. The programs may be stored in a storage medium such as a hard disk, a compact disk, a magnet optical disk or a memory card and installed on the computer therefrom.

Especially, the controller 3 of the cleaning apparatus 1 in accordance with the present illustrative embodiment can control the cleaning apparatus 1, such that even when one of the two-fluid cleaning unit 21 and the scrubbing unit 22 is unusable in one cleaning module 2 of the eight cleaning modules 2, the one cleaning module 2 can be used by performing the rest usable processing unit. Hereinafter, such a control will be described in detail.

In order to operate the usable processing unit, the controller 3 acquires information on whether each unit can be used or not from various sensors provided at opening/closing valves capable of starting and stopping the supply of a cleaning liquid or a gas in the two-fluid cleaning unit 21, a level switch of a cleaning liquid tank, a motor capable of rotating the scrubber of the scrubbing unit 22, and so forth. Then, based on the acquired information, the controller 3 finds out the cleaning module 2 incapable of performing at least one of the process A and the process B. Then, the controller 3 creates relation information by relating the cleaning module 2 (i.e., trouble module) found out to be incapable of performing at least one of the process A and the process B to the process (i.e., exception process) that cannot be performed in the trouble module, and then, stores this relation information in the storage unit 31. That is, in the cleaning module 2 that is not related to the exception process in the storage unit 31, both of the process A and the process B can be performed. Here, the stored relation information on the trouble module and the exception process serves as member operating possibility information indicating which processing member (the two-fluid cleaning unit 21 or the scrubbing unit 22) is usable in the trouble module.

Further, the controller 3 is configured to set control jobs (CJs) and process jobs (PJs) performed in each CJ. A single CJ is a group unit of process jobs (PJs) set for each wafer W. In accordance with the present illustrative embodiment, the CJ is set for each of the FOUP1 to the FOUP4. Information that specifies a process recipe to be performed on each wafer W may be set on the PJ.

Figure 4:
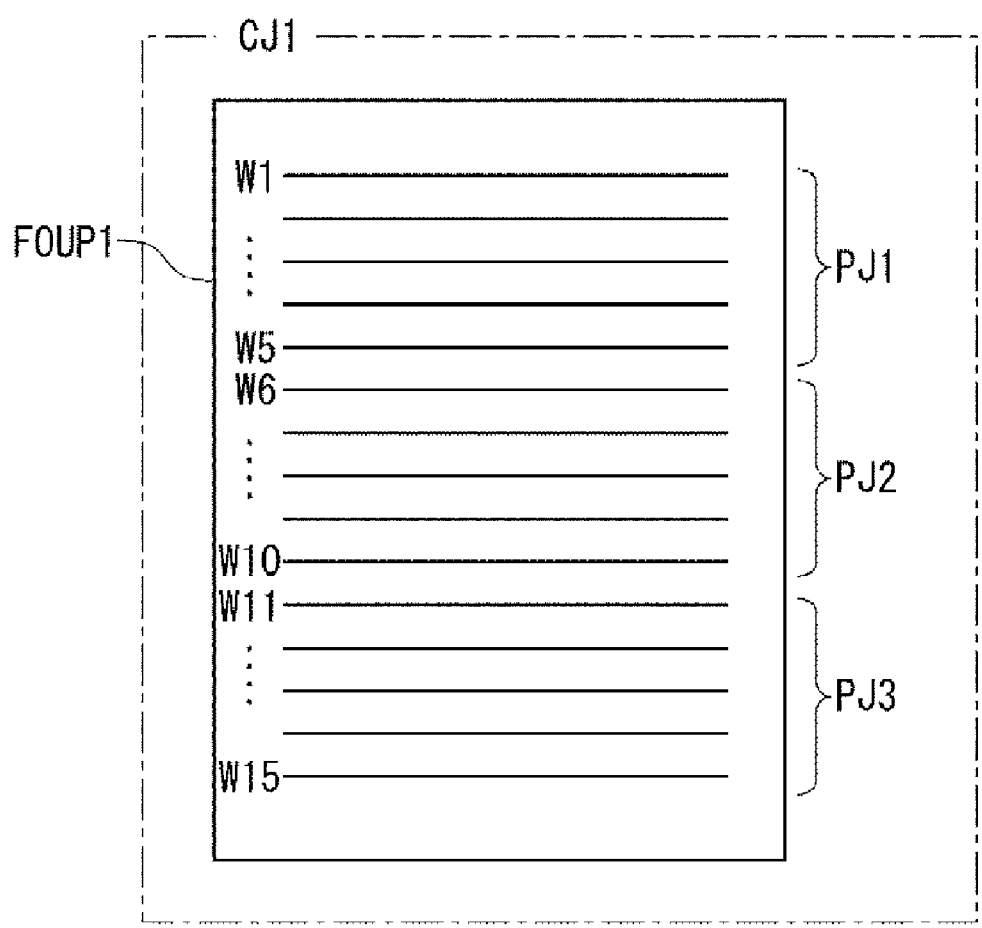
FIG. 4 is an explanatory diagram illustrating an example of setting a CJ and PJs.

By way of example, as shown in FIG. 4, there will be described for the case of setting a process job (PJ) for each of fifteen sheets of wafers W1 to W15 accommodated in one FOUP1 among the FOUP1 to the FOUP4. Here, each of the FOUP1 to the FOUP4 has 15 slots stacked in a vertical direction to hold thereon the wafers W horizontally.

Figure 5:
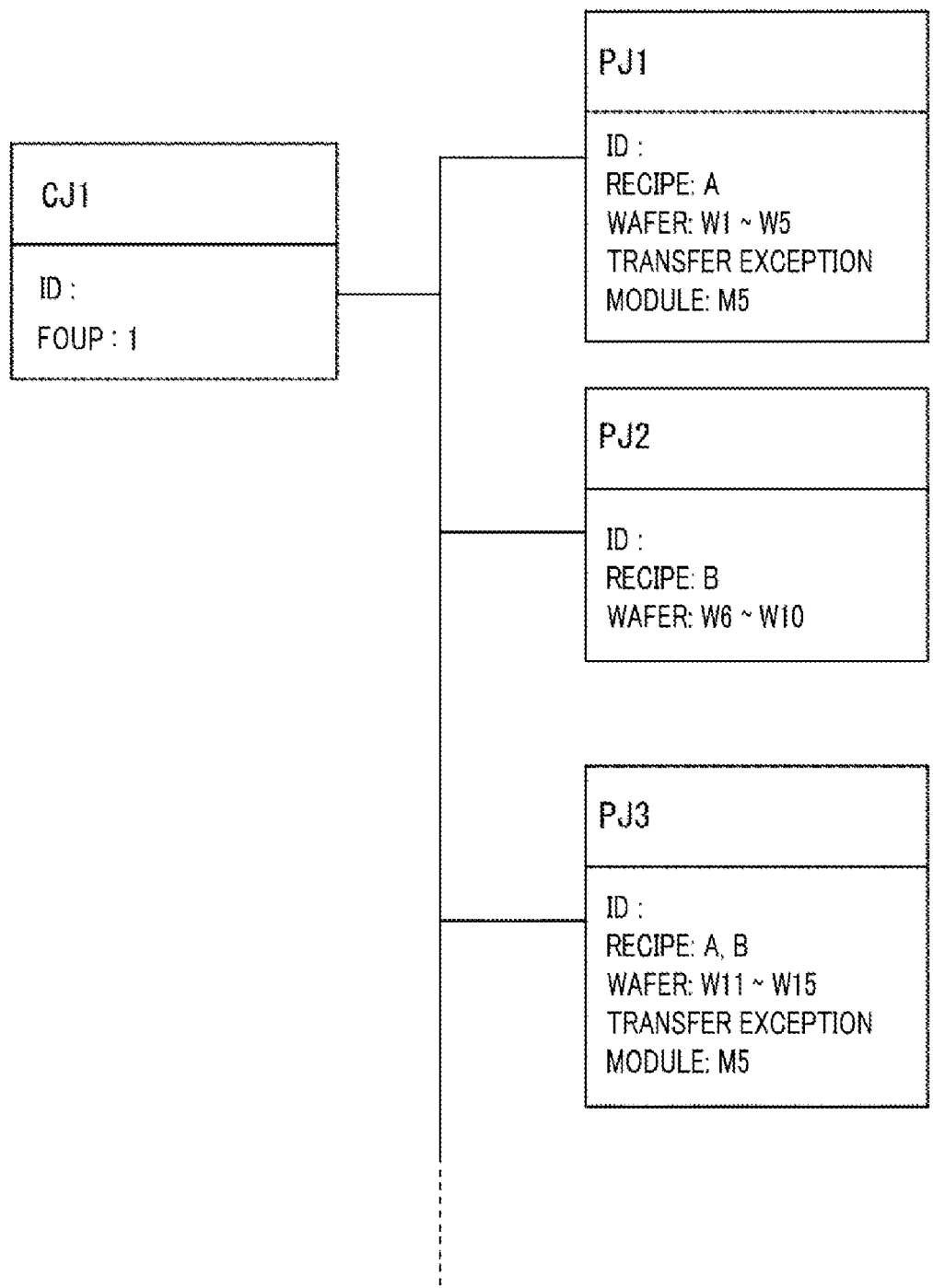
FIG. 5 is an explanatory diagram illustrating an example screen for setting and checking the CJ and the PJs in the cleaning apparatus.

As can be seen from a screen for setting and checking CJ and PJs in FIG. 5, each CJ includes an ID as a unique number and information specifying the FOUP1 to the FOUP4 on which the CJ having that ID is set.

A multiple number of the PJs can be set for each CJ. In FIGS. 4 and 5, three PJs (PJ1 to PJ3) are set for a single CJ1. Each PJ includes an ID as a unique number, information specifying wafers W on which a PJ having that ID is set, information specifying a kind of a recipe to be performed, information (process recipe information) such as process parameters, and so forth. Wafers W1 to W15 for which the respective PJs are to be performed may be specified by slot positions of the FOUP1 (FOUP2, FOUP3 or FOUP 4).

In the example shown in FIGS. 4 and 5, the CJ1 includes the three PJs (PJ1 to PJ3). The PJ1 configured to perform only a two-fluid cleaning process (process A) is set for five wafers W1 to W5, and the PJ2 configured to perform only a scrub cleaning process (process B) is set for the next five wafers W6 to W10. The PJ3 configured to perform a two-fluid cleaning process and a scrub cleaning process (process A and process B) consecutively is set for the rest five wafers W11 to W15. The PJs, which are set for the respective wafers W and include process recipe information, are stored in the storage unit 31 serving as a recipe storage unit.

Further, the controller 3 in accordance with the present illustrative embodiment is configured to compare the previously found out kind of the exception process that cannot be performed in the trouble module with the kind of the process set in each PJ. When a process corresponding to the exception process is included in the recipe of the PJ, the controller 3 may set, in the PJ, the trouble module related to the exception process as a transfer exception module.

For example, among the cleaning modules 2 (M1 to M8) shown in FIG. 3, the cleaning module M5 is set as the trouble module incapable of performing the two-fluid cleaning process (process A). The process A is included in the process recipes of the PJ1 and the PJ3 among the PJ1 to the PJ3 shown in FIG. 5, and the process A is set as the exception process that cannot be performed in the trouble module M5. Thus, the trouble module M5 may be set in the PJ1 and the PJ3 as the transfer exception module.

The controller 3 is configured to create a transfer schedule showing a timing for transferring each wafer W between one of the FOUP1 to the FOUP4 and the cleaning module 2 (one of M1 to M8) and target cleaning modules 2 (M1 to M8) as transfer destinations, based on the PJ set for each wafer W. In creating the transfer schedule, when a transfer exception module is set in a PJ, the controller 3 creates the transfer schedule while excluding the transfer exception module (i.e., the trouble module) from the transfer destinations of the wafer W for which the corresponding PJ is set.

Figure 6:
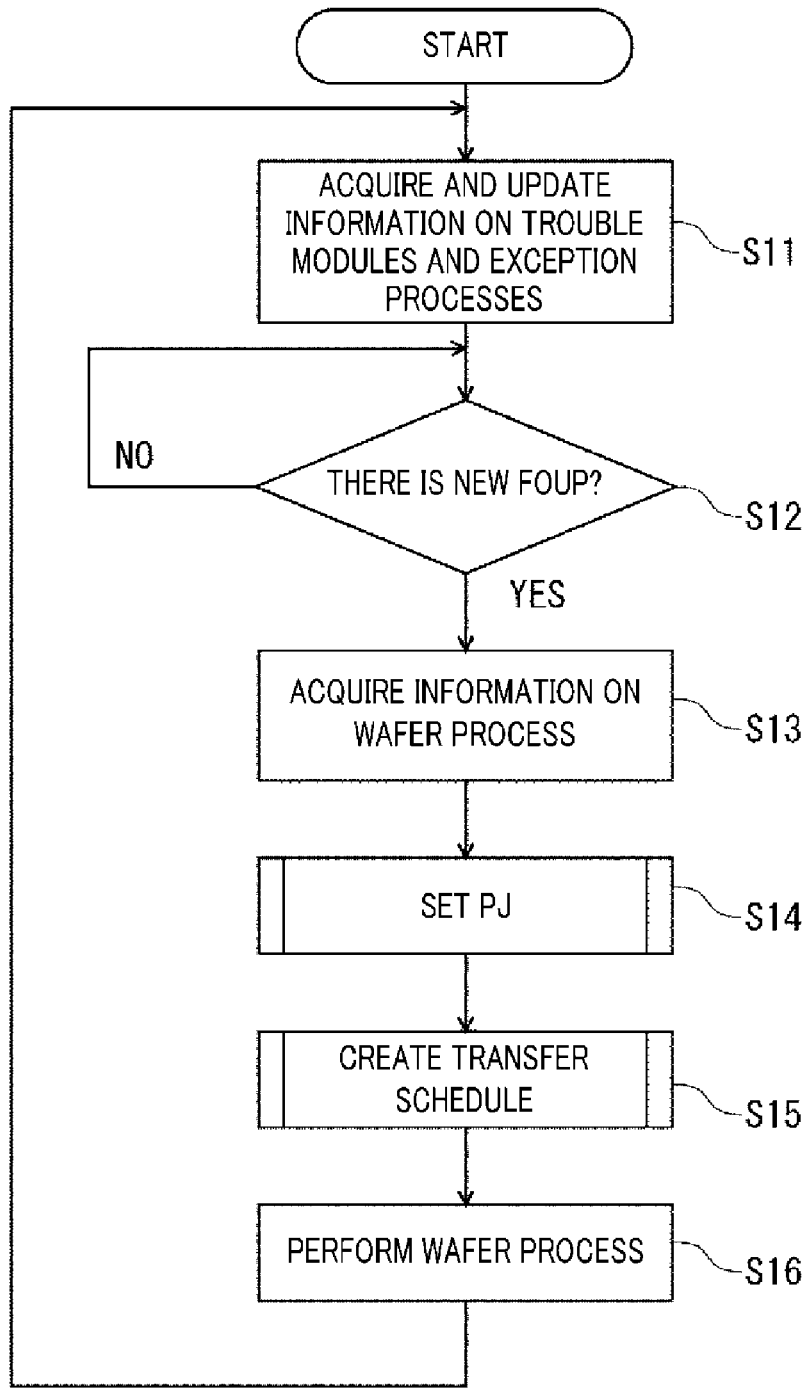
FIG. 6 is a flowchart for describing a sequence of operations until a wafer process is performed in the cleaning apparatus.
Figure 7:
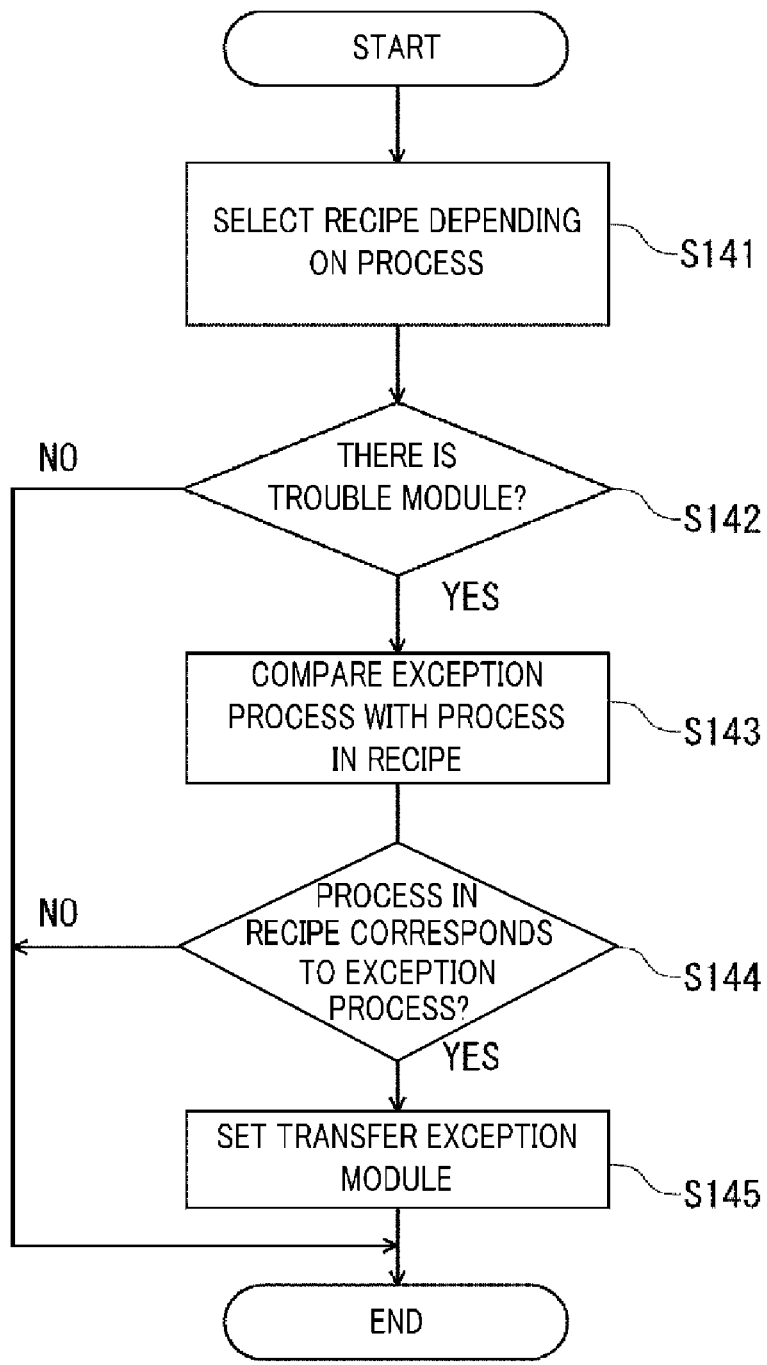
FIG. 7 is a flowchart for describing a sequence of operations for setting the PJ for each wafer.
Figure 8:
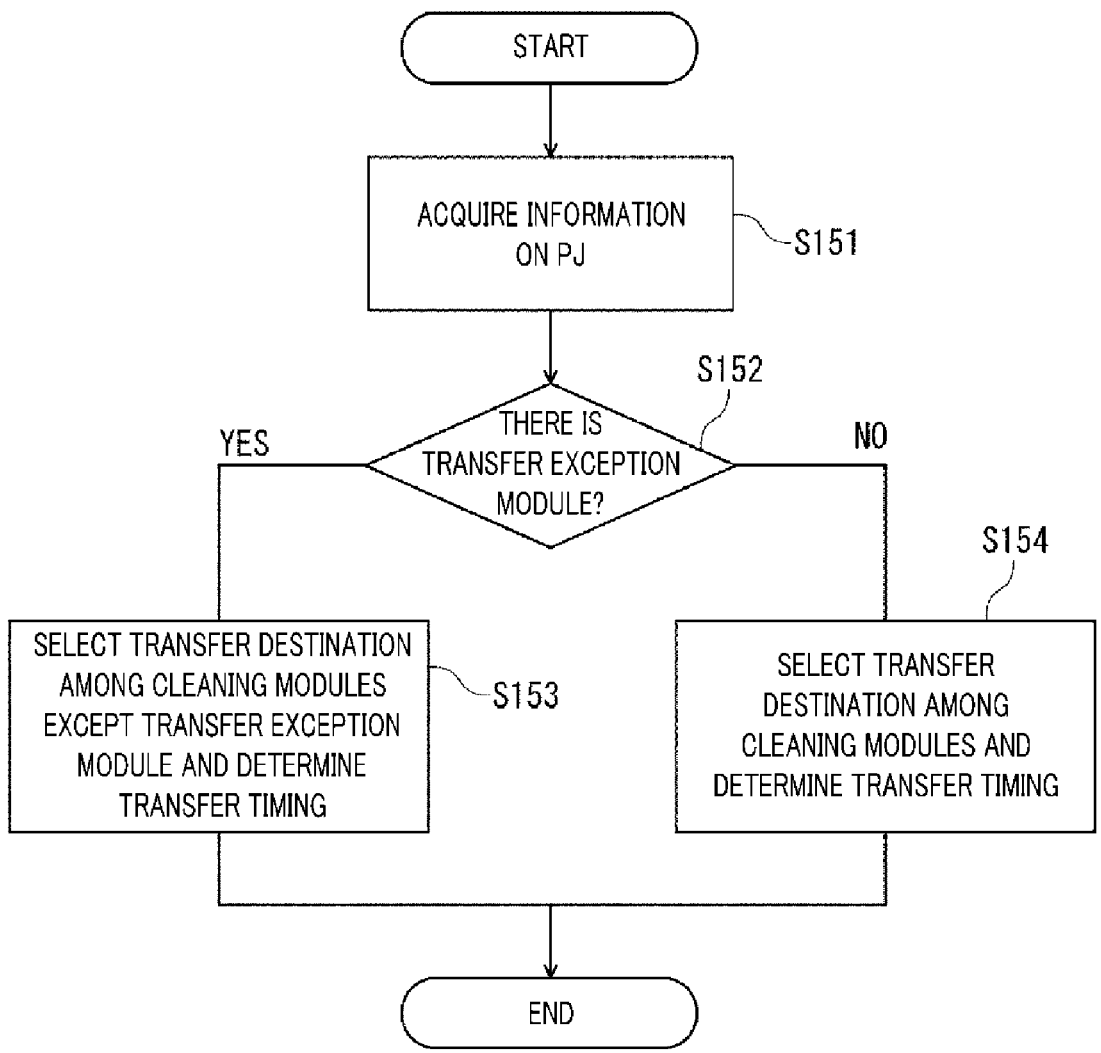
FIG. 8 is a flowchart for describing a sequence of operations for creating a transfer schedule of each wafer.

Operations of the cleaning apparatus 1 having the above-described configuration will be elaborated with reference to FIGS. 6 to 8.

As shown in FIG. 6, the controller 3 acquires information on a trouble module and an exception process before a new FOUP (FOUP1 to FOUP4) is transferred. Then, the controller 3 creates relation information by relating information specifying the trouble module (at least one of M1 to M8) to information specifying the exception process (at least one of A and B), and then, stores this relation information in the storage unit 31 (step S11, a process performing possibility determining process).

Then, the controller 3 waits for a new FOUP (FOUP1 to FOUP4) accommodating therein wafers W as target objects to be transferred (step S12; NO). If a new FOUP (FOUP1 in the example of FIG. 4) is transferred (step S12; YES), the controller 3 acquires contents of the processes to be performed on each of the wafers W within the FOUP1 (e.g., information on a recipe for each of the wafers W) (step S13).

Subsequently, the controller 3 sets a PJ for each wafer W based on the content of the process to be performed on the wafer W. Then, the controller 3 stores the PJ in the storage unit 31 (step S14, a storing process).

FIG. 7 is a flowchart for describing a sequence of operations for setting a recipe and a transfer exception module on a PJ of a single wafer W during the operation of setting the PJs in step S14. By way of example, when setting PJs for wafers W starting from a wafer W located at the uppermost slot of the FOUP1 in sequence, if a PJ for a next wafer W is set (START), the controller 3 selects a recipe depending on the kind of the process to be performed on the wafer W and sets a PJ for the wafer W (step S141). In the example shown in FIG. 5, the controller 3 sets a recipe including a two-fluid cleaning process (process A) for the PJs of wafers W1 to W5; sets a recipe including a scrub cleaning process (process B) for the PJs of wafers W6 to S10; and sets a recipe including both the two-fluid cleaning process (process A) and the scrub cleaning process (process B) for PJs of wafers W11 to W15.

Thereafter, the controller 3 checks whether there is a trouble module (step S142). If there is no trouble module (step S142; NO), the controller 3 does not set a transfer exception module, and the operation of setting the recipe is ended (END).

Meanwhile, if there is a trouble module (step S142; YES), the controller 3 compares the kind of the exception process related to the trouble module with the kind of the process set in the PJ (step S143).

As a result of comparison, if a process corresponding to the exception process is not included in the PJ (step S144; NO), the controller 3 ends the operation of setting the recipe without setting a transfer exception module (END). For example, when the trouble module M5 cannot perform the two-fluid cleaning process (process A), since the process A is not included in the PJ2, as shown in FIG. 5, the operation of setting a transfer exception module is not performed.

Meanwhile, if a process corresponding to the exception process is included in the PJ (step S144; YES), the controller 3 sets information specifying the trouble module as a transfer exception module in the PJ, and ends the operation of setting the recipe and the transfer exception module (END). In the example shown in FIG. 5, since the process A is included in the PJ1 and the PJ3, the information M5 specifying the trouble module is set as the transfer exception module.

If the operation of setting the PJ for each wafer W is ended, the controller 3 creates a transfer schedule based on the PJs set for the wafers W (step S15 of FIG. 6), a transfer schedule creating process). FIG. 8 is a flowchart for describing a sequence of operations for determining whether a transfer schedule for each wafer W is created except for the transfer exception module during the operation of creating the transfer schedule in step S15. Further, FIG. 9 depicts an example transfer schedule created by using the information on the transfer exception module set in the PJs.

FIG. 9 illustrates an example where a transfer schedule is created according to a rule of taking out wafers W1 to W15 from the uppermost slot of the FOUP1 shown in FIG. 4 in sequence, and transferring the wafers W into the cleaning modules 2 in the increasing order of reference numerals M1 to M8. In FIG. 9, between the two kinds of processes performed in the cleaning modules 2 of M1 to M8, a notation 'o' is marked to a process that can be performed and a notation 'X' is marked to a process that cannot be performed. Further, in the transfer schedule shown in FIG. 9, as compared to the time required to perform the cleaning process in each cleaning module 2, the time required for transferring the wafers W between the FOUP1 and each of the cleaning modules 2 (M1 to M8) is much shorter. Thus, there is no standby time caused by the transferring time before the wafers W are loaded and unloaded into and from the cleaning modules 2.

As illustrated in FIG. 8, when creating a transfer schedule (START), the controller 3 acquires information on the PJs for each wafer W (step S151), and checks whether a transfer exception module is set in each PJ (step S152). Then, when a transfer exception module is set in a PJ for a certain wafer W (step S152; YES), the controller 3 selects a transfer destination of that wafer W among the cleaning modules except the transfer exception module, and then, the controller 3 determines a transfer timing of that wafer W (step S153).

By way of example, in the PJ1 set for the wafers W1 to W5, M5 is set as the transfer exception module (FIG. 5). Accordingly, in creating the transfer schedule according to the aforementioned rule, the controller 3 creates the transfer schedule in which the wafer W1 is transferred into the cleaning module 2 of M1 and the wafer W2 is transferred into the cleaning module of M2 in sequence, as depicted in FIG. 9. Further, when creating the transfer schedule of the wafer W5, since M5 is set as the transfer exception module in the PJ for this wafer W5, the controller 3 excepts the module M5 from the transfer destinations of the wafer W5 and creates the transfer schedule in which the wafer W5 is transferred into the next module M6. Accordingly, the wafer W on which the two-fluid cleaning process is performed may not be loaded into the cleaning module 2 of M5 which is incapable of performing the two-fluid cleaning process (process A).

Further, if no transfer exception module is set in the PJ (step S152 of FIG. 8; NO), the controller 3 selects a transfer destination and determines a transfer timing without performing the excluding of a transfer exception module (step S154).

In the example shown in FIG. 5, a transfer exception module is not set in the PJ2 for the wafers W6 to W10. Accordingly, the controller 3 can select transfer destinations of these wafers W from all the cleaning modules 2. Among the cleaning modules 2 of M5, M7 and M8 which are not performing a wafer process, the controller 3 selects the module M5 having a smallest reference number as the transfer destination of the wafer W6. Subsequently, the controller 3 selects M7 and M8 that are not currently performing a wafer process as transfer destinations of the wafers W7 and W8, respectively, and selects M1 and M2 that have completed the processes on the wafers W1 and W2 as transfer destinations of the wafers W9 and W10, respectively.

As a result, the wafer W on which the two-fluid cleaning process is not performed and the scrubber cleaning process is performed is transferred into the cleaning module 2 of M5 which is incapable of performing the two-fluid cleaning process (process A) and capable of performing the scrubber cleaning process (process B). Thus, a highly efficient transfer schedule can be created.

Subsequently, since M5 is set as the transfer exception module in the PJ3 of the wafers W11 to W15 taken out of the FOUP1, the controller 3 creates a transfer schedule in which the wafers W11 to W15 is transferred into the modules M3, M4 and M6 to M8, which have completed the processes on the wafers W, in sequence among the cleaning modules 2 except the transfer exception module, as in the same manner in transferring the wafers W1 to W5 (step 152 of FIG. 8; YES, step S153).

In this way, if the controller 3 completes creating the transfer schedule for each wafer W (step S15 of FIG. 6), the controller 3 transfers each wafer W into the corresponding cleaning module 2 based on the created transfer schedule and performs a target process on the wafer W according to the recipe set in the PJ (step S16, a processing process). Then, the controller 3 updates information on the trouble modules and the exception processes before a next transfer schedule is created (step S11) and waits for a transfer of the FOUP1 to the FOUP4 accommodating therein wafers W as target objects.

By using the cleaning apparatus 1 in accordance with the present illustrative embodiment, following effect can be achieved. As for the cleaning module 2 found to be incapable of performing either one of the two-fluid cleaning process (process A) and the scrub cleaning process (process B), the cleaning module 2 and the kind of the process that can be performed in this cleaning module 2 may be specified. Then, a transfer schedule using this cleaning module 2 is created for the wafer W on which a process corresponding to this specified process is supposed to be performed. Thus, it is possible to efficiently perform the substrate process.

Figure 10:
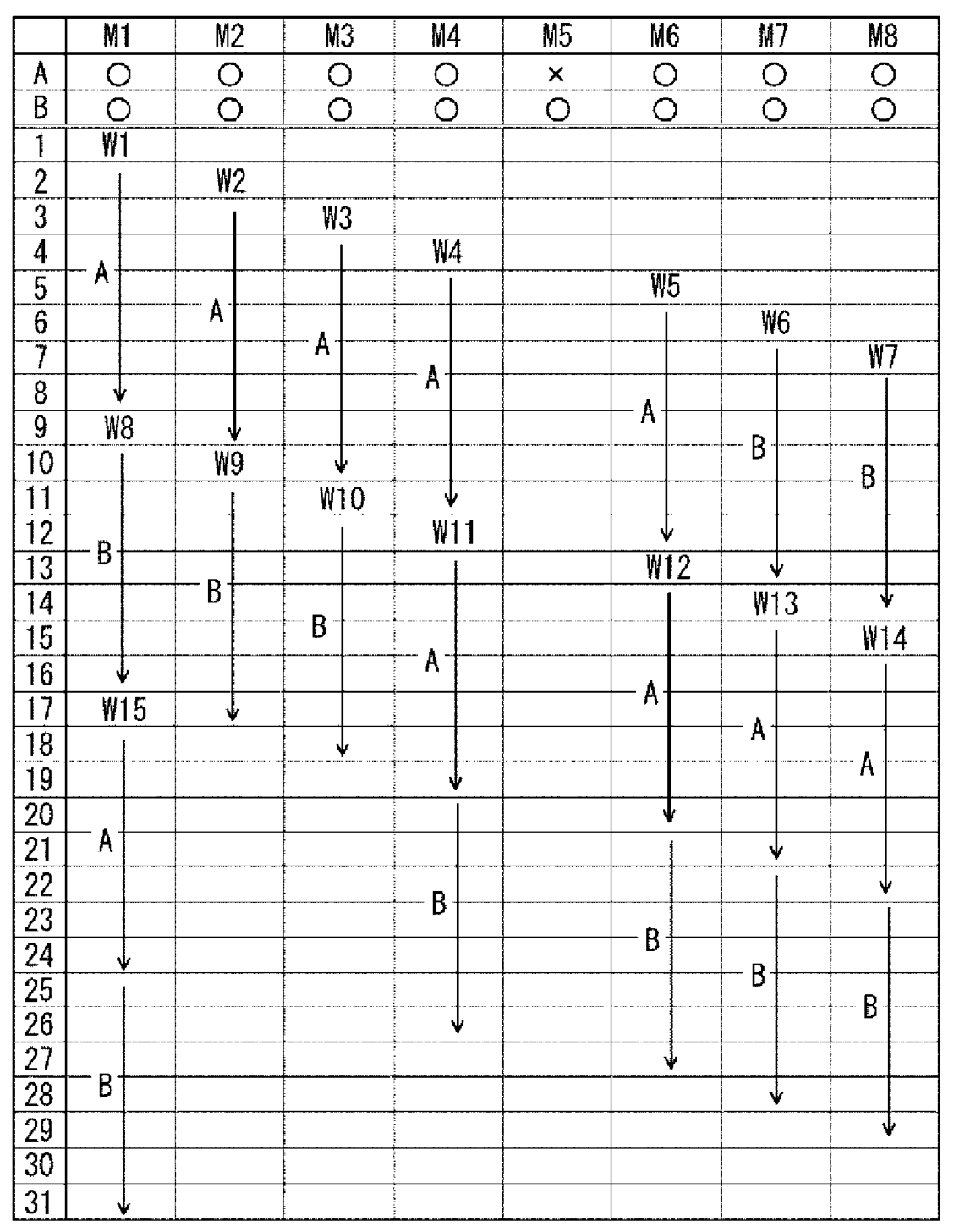

Here, in order to verify the effect of the present illustrative embodiment, FIG. 10 illustrates a comparative example. In the comparative example, a transfer schedule of all wafers W1 to W15 is created while excluding the cleaning module 2 (M5) in which the two-fluid cleaning process (process A) cannot be performed from transfer destinations of the wafers W1 to W15. Here, the process recipes of all wafers W1 to W15 are set in the PJ1 to the PJ3, as the same as in the case of FIG. 5. In the transfer schedule shown in FIG. 10, even the wafers W6 to W10 that are subjected to only the scrub cleaning process (process B) cannot be processed in the cleaning module 2 of M5. Accordingly, it may take a longer time to complete the processes of the wafers W1 to W15, as compared to the case of FIG. 9. That is, the cleaning apparatus 1 in accordance with the present illustrative embodiment has a higher throughput.

Figure 11:
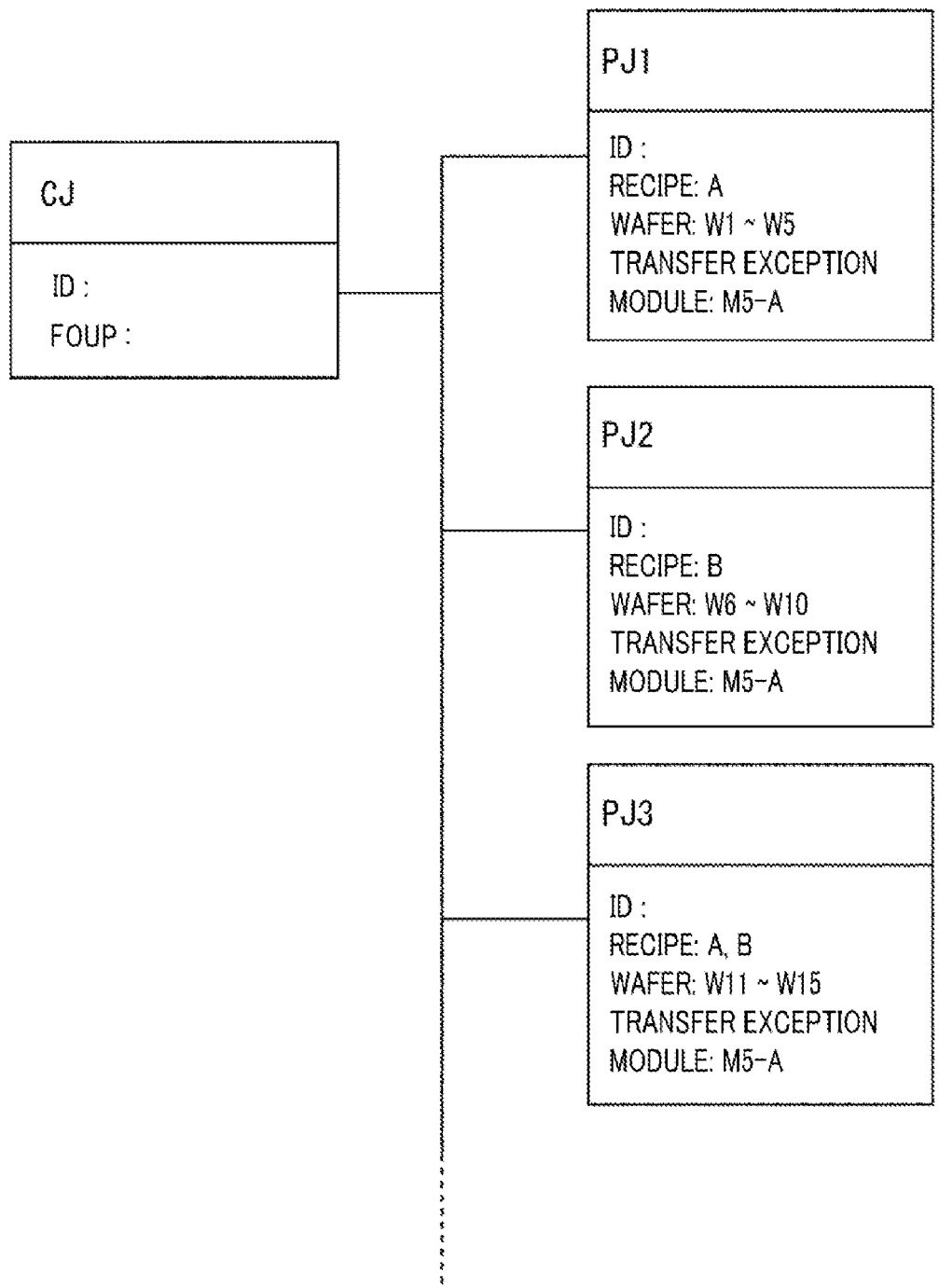
FIG. 11 is an explanatory diagram illustrating an another example screen for setting and checking a CJ and PJs in accordance with another example.

Further, an information structure of the transfer exception module and the PJ in which the transfer exception module is set may not be limited to the example shown in FIG. 5. By way of example, in an example shown in FIG. 11, information 'M5-A' obtained by relating information M5 specifying the trouble module to the kind of the process that cannot be performed in this trouble module is set in all the PJs (PJ1 to PJ3) as transfer exception module information.

In such a case, the controller 3 does not perform the operations of steps S142 and S143 in FIG. 7 and sets a transfer exception module for all the wafers W (step S145). Then, in step S152 shown in FIG. 8, the controller 3 compares the kind of the process set in each PJ with the kind of the exception process included in the transfer exception module information. If these processes are identical to each other, the controller 3 selects a transfer destination among the cleaning modules 2 except the transfer exception module (step S153). If these processes are not identical, the transfer destination is selected among all the cleaning modules 2 without performing the excluding of the transfer exception module (step S154).

Now, a method of creating a transfer schedule in a cleaning apparatus in accordance with a second illustrative embodiment will be described. The cleaning apparatus in accordance with the second illustrative embodiment is different from the cleaning apparatus of the first illustrative embodiment in that a trouble module into which a wafer W would not be transferred is previously designated, and each PJ may be set to cancel such designation depending on the kind of the process that can be performed in the trouble module.

By way of example, there will be described for the case of canceling the designation of the trouble module for the PJs (PJ1 to PJ3). Here, the same process recipes as shown in FIGS. 4 and 5 are set for the PJ1 to PJ3 in the cleaning apparatus 1 as shown in FIGS. 1 to 3. As in the first illustrative embodiment, among the cleaning modules 2 of M1 to M8, M5 is incapable of performing the two-fluid cleaning process (process A).

Figure 12:
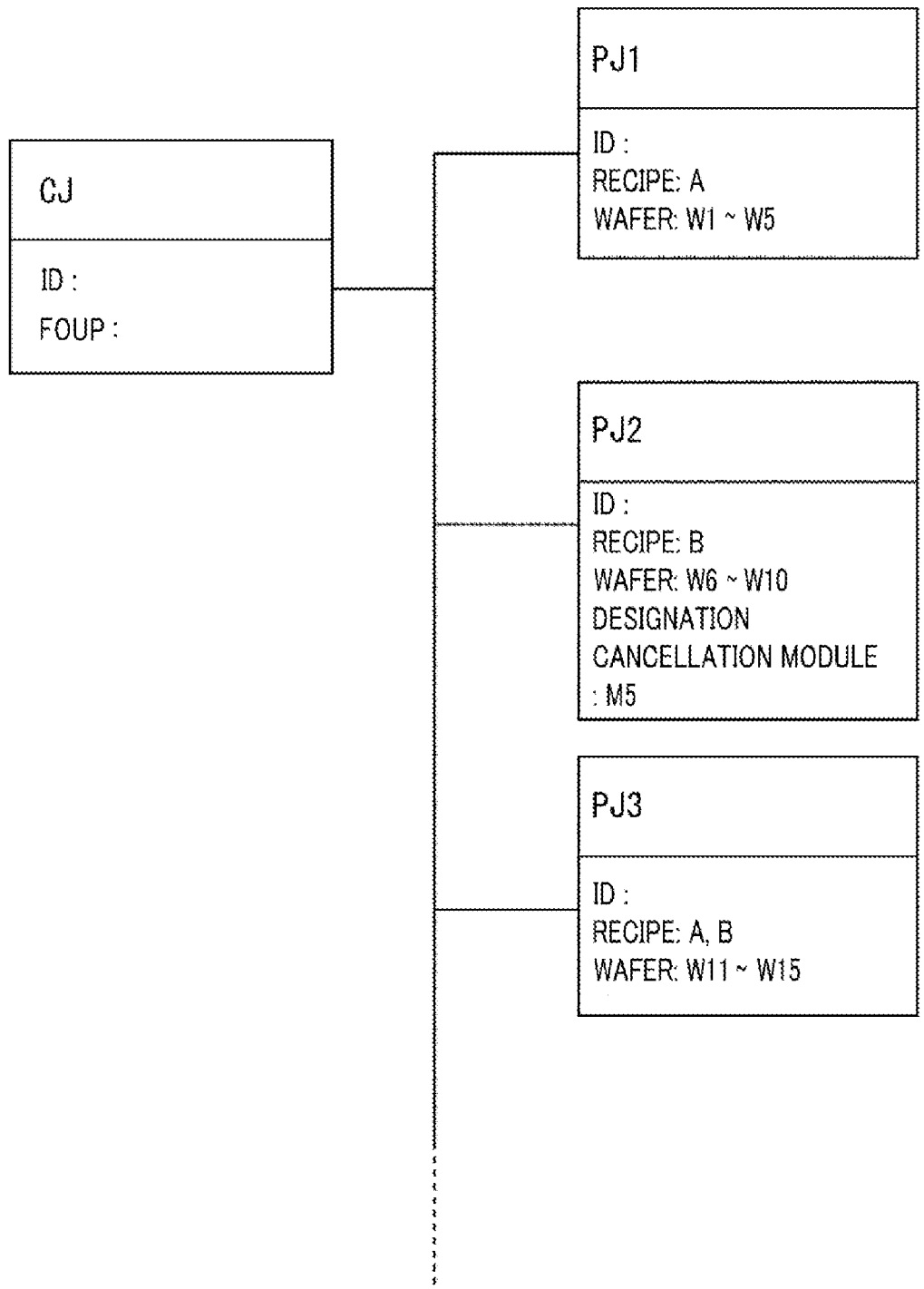
FIG. 12 is an explanatory diagram illustrating an example screen for setting and checking a CJ and PJs of a cleaning apparatus in accordance with a second illustrative embodiment.

As depicted in FIG. 12, in accordance with the second illustrative embodiment, information specifying a designation cancellation module is set for the PJ2 in which only the scrub cleaning process (process B) that can be performed in the trouble module is set as a process recipe. This is different from the first illustrative embodiment (FIG. 5) in which the transfer exception module is set in the PJ1 and the PJ3 including the process that cannot be performed. That is, the process recipe of the PJ2 does not have the kind of the process that cannot be performed in the trouble module.

Figure 13:
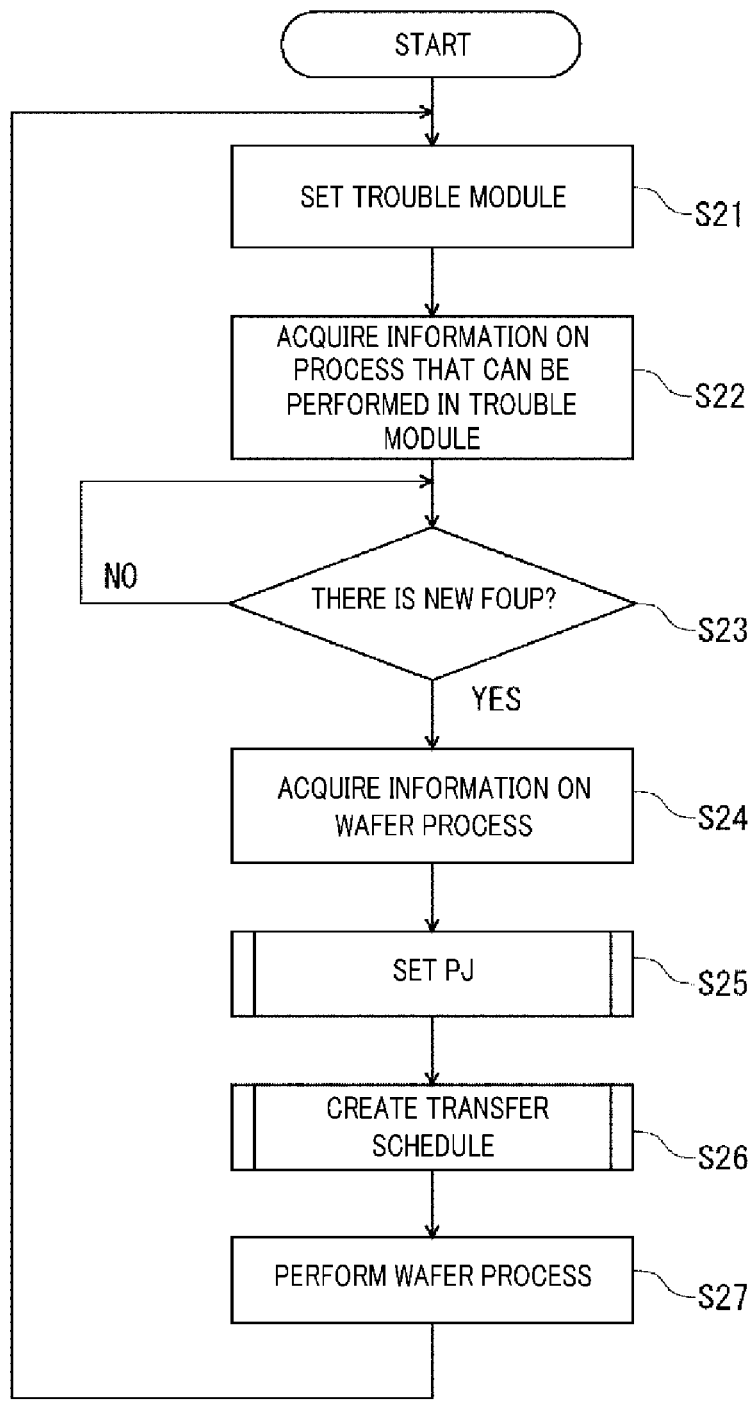
FIG. 13 is a flowchart for describing a sequence of operations until a process is performed on a wafer.
Figure 14:
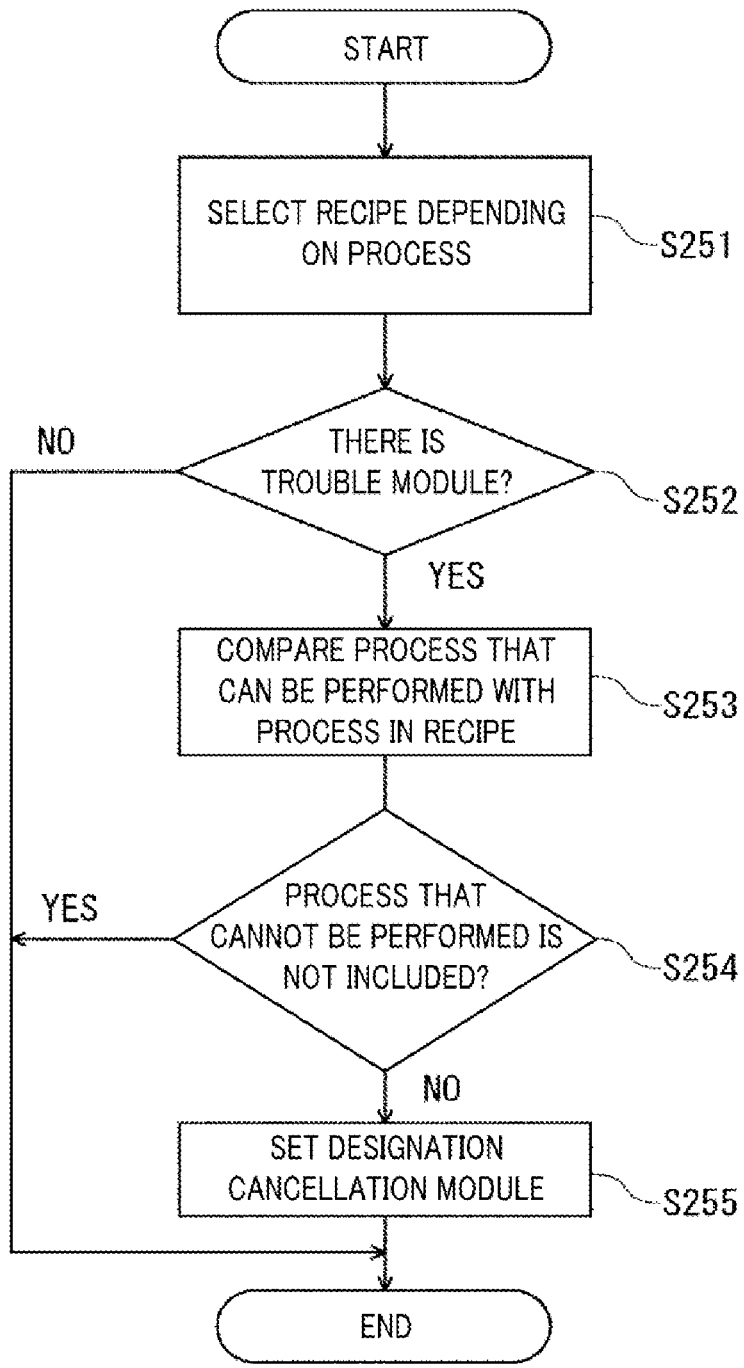
FIG. 14 is a flowchart for describing a sequence of operations for setting the PJ for each wafer.

Below, a different operation of the controller 3 from that of the first illustrative embodiment will be described. As shown in FIG. 13, in the cleaning apparatus 1 in accordance with the second illustrative embodiment, the controller 3 sets a cleaning module 2 in which a process cannot be performed as a trouble module (step S21). Then, the controller 3 acquires information on the kind of the process that can be performed in this trouble module (step S22). Thereafter, as shown in FIG. 14, when setting a PJ, the controller 3 checks whether there is a trouble module (step S252). If there is a trouble module (step S252; YES), the controller 3 compares the kind of the process that can be performed in the trouble module with the kind of the process set in each PJ (step S253).

If a PJ does not have the kind of the process that cannot be performed in the trouble module (step S254; NO), information specifying a designation cancellation module is set in the PJ (step S255).

Figure 15:
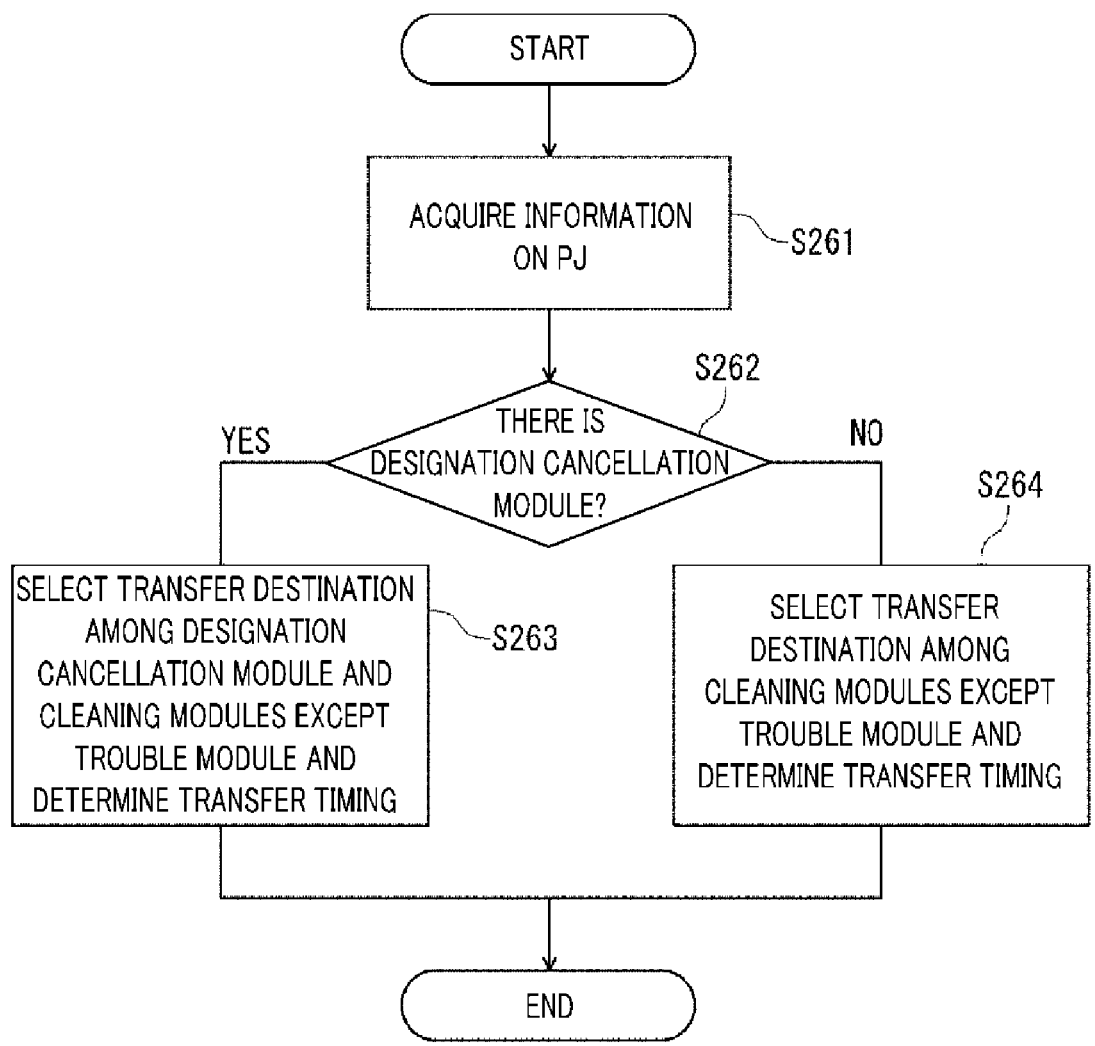
FIG. 15 is a flowchart for describing a sequence of operations for creating a transfer schedule of each wafer.

Based on the PJ1 to the PJ3 (FIG. 12) set as described above, if the information specifying the designation cancellation module is included in a PJ (step S262 of FIG. 15; YES), the controller 3 selects a transfer destination of the wafer W among the designation-canceled cleaning module 2 and the cleaning modules 2 except other trouble modules (step S263). That is, the trouble module set as the designation cancellation module is excluded from the transfer exception modules and included in the transfer schedule. Meanwhile, if there is no information specifying the designation cancellation module (step S262; NO), the controller 3 selects a transfer destination among the cleaning modules 2 except the trouble modules (step S264).

Through the above-described operation, the cleaning apparatus 1 configured to designate a trouble module and specify a designation cancellation module in accordance with the second illustrative embodiment is capable of creating the same transfer schedule as illustrated in FIG. 9.

Further, in the cleaning apparatus 1 in accordance with the second illustrative embodiment, it may be possible to set, for all PJs (PJ1 to PJ3), information specifying the designation cancellation module along with the kind of the process that can be performed therein, and to compare this information with the kind of the process set in each PJ when creating the transfer schedule.

In the cleaning apparatuses 1 in accordance with the first and second illustrative embodiments as described above, the operations of relating a process that cannot be performed or a process that can be performed to a corresponding cleaning module 2 and setting a transfer exception module, a designation cancellation module or a trouble module in each PJ are automatically performed by the controller 3. Alternatively, for these setting operations, a screen for setting a transfer exception module, a designation cancellation module and information on whether various kinds of processes can be performed may be displayed on the manipulation unit 18, for example. In this configuration, these setting operations may be performed in response to inputs from an operator.

Further, the kinds of processes that can be performed in each cleaning module 2 may not be limited to the two-fluid cleaning process and the scrub cleaning process. By way of example, this process may be a rear surface cleaning process for cleaning a wafer W by supplying a cleaning liquid onto a rear surface of the wafer W or a chemical liquid cleaning process for cleaning a wafer W by supplying an acid chemical liquid (first processing liquid) and an alkaline chemical liquid (second processing liquid) onto the wafer W that is being rotated. Furthermore, this process may not be limited to the cleaning process but may be a coating and developing process for supplying a resist liquid or a developing liquid onto a wafer W, or a plating process for supplying a plating liquid. In these cases, devices configured to perform these processes correspond to the processing members. The method of performing these processes may not be limited to supplying a processing liquid onto a front surface or a rear surface of a wafer W that is being rotated. By way of example, the processes may be performed by immersing a wafer W in a processing liquid in a processing vessel.

The number of the kinds of processes included in the cleaning module 2 may not be limited to two, but more than three kinds of processes may be performed. In such a case, the more than three processes may be divided in two: processes that cannot be performed and processes that can be performed. Then, by comparing these divided processes with the kinds of the processes in the PJs and setting the transfer exception module (or designation cancellation module) in each PJ, the transfer destination can be selected when creating the transfer schedule.

Besides, as in the case of performing the two-fluid cleaning processes in the processing modules 2 of M1 to M4 in parallel and then performing the scrub cleaning processes in the processing modules of M5 to M8 in parallel, the illustrative embodiments may be applied to an apparatus where wafers W are transferred into different kinds of processing modules 2 in sequence and performing processes therein. In this case, the illustrative embodiments may also be applied to a substrate processing apparatus including different kinds of processing modules that perform different processes and multiple processing modules that have different functions, such as a substrate processing apparatus including a cleaning module 2 configured to perform a cleaning process and a post-cleaning module configured to perform a drying process by using a supercritical fluid after performing the cleaning process.

What is claimed is:

1. A substrate processing apparatus of performing a process on a substrate, the substrate processing apparatus comprising:
    a plurality of processing modules each of which includes at least a first processing member and a second processing member;
    a substrate transfer device configured to transfer substrates into the plurality of processing modules;
    a recipe storage unit configured to store thereon process recipes to be performed on the substrates; and
    a controller configured to control the substrate processing apparatus,
    wherein the controller is configured to store relation information that is made by relating a trouble module, serving as a processing module in which the first processing member is found to be unusable, to an exception process that cannot be performed in the trouble module, wherein the second processing member is usable while the first processing member is unusable,
    the controller is configured to create, based on the relation information and the process recipes to be performed on the substrates, a transfer schedule in which the substrate transfer device transfers the substrates into the plurality of processing modules in parallel,
    the controller is configured to compare a kind of the exception process that cannot be performed in the trouble module with kinds of processes included in the process recipes, and when a process corresponding to the exception process is included in the process recipes, the controller is configured to set the trouble module related to the exception process as a transfer exception module and exclude the trouble module from the transfer schedule, and
    if the exception process that cannot be performed in the trouble module is not included in the kinds of processes of the process recipes, the controller is configured to cancel the trouble module from the transfer exception module.

2. The substrate processing apparatus of claim 1,
    wherein the first processing member and the second processing member are configured to perform, on the substrates, processes selected from a process group consisting of a two-fluid cleaning process, a scrub cleaning process, a substrate rear surface cleaning process, a chemical liquid cleaning process, a coating and developing process and a plating process.

3. A substrate transfer method of performing a process on substrates in parallel in a plurality of processing modules each of which is capable of performing at least a first process and a second process on the substrates, the substrate transfer method comprising:
    a storing process of storing relation information that is made by relating a trouble module, serving as a processing module in which the first process cannot be performed, to an exception process that cannot be performed in the trouble module, wherein the second process can be performed by the trouble module while the first process cannot be performed;

a process performing possibility determining process of determining whether it is possible to perform each of the first process and the second process in each of the plurality of processing modules;

a transfer schedule creating process of creating, based on process recipes regarding processes to be performed on the substrates and the relation information, a transfer schedule in which a substrate transfer device transfers the substrates into the plurality of processing modules in parallel after the process performing possibility determining process; and a substrate processing process of transferring the substrates within a transfer vessel into the plurality of processing modules according to the transfer schedule and performing processes thereon, wherein the transfer schedule is created such that a kind of the exception process that cannot be performed in the trouble module is compared with kinds of processes included in the process recipes, and when a process corresponding to the exception process is included in the process recipes, the trouble module related to the exception process is set as a transfer exception module and the trouble module is excluded from the transfer schedule, and if the exception process that cannot be performed in the trouble module is not included in the kinds of processes of the process recipes, the trouble module is canceled from the transfer exception module.

4. A non-transitory computer-readable storage medium having stored thereon computer-executable instructions that, in response to execution, cause a substrate processing apparatus to perform a substrate transfer method as claimed in claim 3, wherein the substrate transfer apparatus is configured to perform a process on a substrate.

* * * * *